United States Patent
Shoundrabalan et al.

(10) Patent No.: US 10,340,856 B2
(45) Date of Patent: Jul. 2, 2019

(54) RESONANCE MITIGATION IN RF HIGH POWER AMPLIFIER ENCLOSURE

(71) Applicant: CENTRE FOR DEVELOPMENT OF TELEMATICS, New Delhi (IN)

(72) Inventors: Theepak Shoundrabalan, Bengaluru (IN); Vijaya Suresh Namburi, Bengaluru (IN); Selvapriya Radhakrishnan, Bengaluru (IN); Devadas Bhaskaran, Bengaluru (IN); Soundarakumar Masilamani, Bengaluru (IN); Vipin Tyagi, New Delhi (IN)

(73) Assignee: CENTRE FOR DEVELOPMENT OF TELEMATICS, New Delhi (IN)

( * ) Notice: Subject to any disclaimer, the term of this patent is extended or adjusted under 35 U.S.C. 154(b) by 76 days.

(21) Appl. No.: 15/597,448

(22) Filed: May 17, 2017

(65) Prior Publication Data

US 2018/0041172 A1 Feb. 8, 2018

(30) Foreign Application Priority Data

Aug. 2, 2016 (IN) .............................. 201611026390

(51) Int. Cl.

| | |
|---|---|
| *H03F 1/08* | (2006.01) |
| *H03F 3/189* | (2006.01) |
| *H03F 3/20* | (2006.01) |
| *H01L 23/552* | (2006.01) |
| *H01L 23/66* | (2006.01) |
| *H03F 3/24* | (2006.01) |

(52) U.S. Cl.
CPC ............. *H03F 1/08* (2013.01); *H01L 23/552* (2013.01); *H01L 23/66* (2013.01); *H03F 3/189* (2013.01); *H03F 3/20* (2013.01); *H03F 3/24* (2013.01); *H01L 2223/6644* (2013.01); *H03F 2200/114* (2013.01); *H03F 2200/451* (2013.01)

(58) Field of Classification Search
CPC ... H03F 1/08; H03F 3/189; H03F 3/20; H03F 3/24; H03F 2200/114; H01L 23/552; H01L 2223/6644
USPC .......................................................... 333/12
See application file for complete search history.

(56) References Cited

U.S. PATENT DOCUMENTS

| | | | |
|---|---|---|---|
| 6,448,936 B2 * | 9/2002 | Kopf ...................... H01O 13/10 343/767 |
| 2008/0296735 A1* | 12/2008 | Takehara ............ H01L 23/3114 257/621 |
| 2011/0013349 A1* | 1/2011 | Morikita .............. H05K 1/0218 361/679.02 |

(Continued)

*Primary Examiner* — Stephen E. Jones
(74) *Attorney, Agent, or Firm* — Harness, Dickey & Pierce, P.L.C.

(57) ABSTRACT

Aspects of the present disclosure generally relate to a RF high power amplifier designed for resonance mitigation. A method for resonance mitigation in RF high power amplifier enclosure and an enclosure for RF high power amplifier designed to mitigate resonance is provided. In an aspect, the enclosure can be configured with a metallic post or a grounded metallic post positioned at a suitable location with RF high power amplifier circuit to dampen and shift out resonance. In an aspect, the metallic post can be placed between printed circuit board (PCB) substrate and enclosure lid. Proposed metallic post solution eliminates the need of RF absorber in the design.

8 Claims, 6 Drawing Sheets

(56) References Cited

U.S. PATENT DOCUMENTS

2017/0237144 A1* 8/2017 Tobar .................. H01P 7/06
333/232

* cited by examiner

RESONANCE MITIGATION IN RF HIGH POWER AMPLIFIER ENCLOSURE

TECHNICAL FIELD

The present disclosure relates generally to the field of RF power amplifiers that find application in electronics. More particularly, it relates to resonance mitigation in a RF amplifier enclosure.

BACKGROUND

Background description includes information that may be useful in understanding the present invention. It is not an admission that any of the information provided herein is prior art or relevant to the presently claimed invention, or that any publication specifically or implicitly referenced is prior art.

Designing of an enclosure for RF power amplifier (RFPA) requires adequate knowledge of electromagnetic field distribution inside the housing. Enclosure design for a high power RF device or appliance is very important as it not only provides mechanical or structural support, but also acts as a suitable path for heat transfer, causing thermal relief, protection against hostile environments such as temperature, humidity, vibration/shock, electromagnetic interference (EMI)/electromagnetic compatibility (EMC) etc.

RFPA with very high power and gain requires multiple stages of amplification. This multistage amplification combined with Doherty configuration increases the size of the RFPA. Resonance mode exists in a cavity if largest cavity dimension in enclosure of the RFPA is greater than or equal to one half of free space wavelength. Conductive surface of enclosure supports several resonant modes, and therefore produces oscillating charges, which in turn induce surface currents on conductive trace of the PCB. Cavity resonance of a high power RF amplifier Enclosure not only degrades electrical performance but can also cause unwanted oscillation in frequency band of interest because of feedback through the resonance mode. Resonance caused inside the enclosure coupled with RFPA device (even in a quiescent state) may even result in catastrophic failure of the device due to peak oscillating voltage exceeding the device' breakdown voltage.

There have been efforts in the art to dampen resonance by suitable placement of RF absorbers, as discussed by P. Dixon in his research titled "Cavity resonance dampening"; J. Dhar, R. K. Arora in their research titled "Enclosure effect on microwave power amplifier"; and Deepak Ghogaonkar, Sanjeev Gupta and Ashish Sarvaiya in their research titled "Interaction of Active MMIC with Package/Housing". To have more attenuation at low frequency, for example around 1-2 GHz, RF absorber has to be cascaded, which increases enclosure height of the power amplifier. Thermal conductivities of RF absorbers are bad, i.e. around 0.2 W/m k, as stated by L. Meyer, S. Jayaram, E. A. Cherney in their research paper titled "Thermal conductivity of filled silicone rubber and its relationship to erosion resistance in the inclined plane test". Therefore, RF absorber blocks the heat radiation through it which in turn increases the temperature of the cavity. To compensate for such increase in temperature, extra cooling mechanism for high power amplifier may be required. Due to the foretold temperature and height issue, the RF absorber is not a good choice.

Another alternative was proposed by D. F. Williams in there search titled "Damping of the resonant modes of a rectangular metal package". This research states that resonant cavity modes can be damped by placing a dielectric substrate coated with a resistive film in the cavity. By using dielectric substance coated with resistive film, Q factor can be reduced to some extent. U.S. Pat. No. 5,030,935 proposes dampening of unwanted resonant modes in an enclosure for microwave circuitry carried on a conductive ground plane by interrupting the ground plane at one or more locations about microwave circuitry. However, the proposed arrangement is not suitable in case of high density circuit.

Therefore, there is a need in the art for providing a method for resonance mitigation in RF high power amplifier enclosure, and also for an enclosure for RF high power amplifier that is designed to mitigate resonance.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, the numbers expressing quantities of ingredients, properties such as concentration, reaction conditions, and so forth, used to describe and claim certain embodiments of the invention are to be understood as being modified in some instances by the term "about". Accordingly, in some embodiments, numerical parameters set forth in the written description are approximations that can vary depending upon the desired properties sought to be obtained by a particular embodiment. In some embodiments, the numerical parameters should be construed in light of the number of reported significant digits and by applying ordinary rounding techniques. Notwithstanding that, the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all groups used in the appended claims.

OBJECTS OF THE INVENTION

A general object of the present disclosure is to provide an arrangement for resonance mitigation in a RF high power amplifier.

An object of the present disclosure is to provide a method of mitigating resonance caused in the device enclosure of a radio frequency high power amplifier (RFPA).

Another object of the present disclosure is to provide a method for resonance mitigation in RF high power amplifier.

Yet another object of the present disclosure is to provide a method for dampening of resonance without raising the temperature of RFPA device enclosure.

Another object of the present disclosure is to provide a RF high power amplifier designed to break down cavity size of its enclosure.

SUMMARY

Aspects of the present disclosure generally relate to a RF high power Amplifier designed for resonance mitigation. A method for resonance mitigation in RF high power amplifier enclosure and an enclosure for RF high power amplifier designed to mitigate resonance is provided. In an aspect, the enclosure can be configured with a metallic post (also known as "metallic grounded post" and these terms are being used interchangeably hereinafter) positioned at a suitable location with RF high power amplifier circuit to dampen and shift out resonance.

In an aspect, the metallic post can be placed between printed circuit board (PCB) and enclosure lid, which provides a cost effective way to mitigate resonance caused by the enclosure of the RF power amplifier. The metallic grounded post can be used to break down cavity size inside the enclosure. In an embodiment, the grounded metallic post can be designed using Keysight EMPro. In another aspect, the metallic post can be arranged inside the enclosure to reflect the waves generated by the resonance of the enclosure.

In a preferred aspect, a method based on reflection of waves for suppressing/mitigating resonance in RF high power amplifier enclosure is provided. TE101 mode is the dominant mode. The poynting vector is proportional to the square of the E-field in TE101 mode. The method includes the steps of: evaluating electric field that would be generated by the enclosure; determining location inside enclosure of the RF amplifier where E-field is maximum; and placing a metallic post at the location where E-field is maximum so as to mitigate resonance in the RF power amplifier. The metallic post is kept where E-Field is maximum, as poynting vector is maximum at that point. In an exemplary implementation, location of maximum E-field can be determined based on evaluation of maximum E-field location of transverse electric mode i.e. TE101 mode, wherein E-field for transverse electric mode TE101 can be estimated using the equation below:

$$E_y = \frac{\beta_x}{\varepsilon} A_{101} \operatorname{Sin}\left(\frac{\pi x}{a}\right) \operatorname{Sin}\left(\frac{\pi z}{c}\right) \quad (1)$$

-continued
$$P = \frac{|E_y|^2}{2\eta} a_z \quad (2)$$

Where P is poynting vector. Poynting vector propagates in the wave direction.

As one may appreciate, the metallic post is a cheaper solution compared to isolating different stages or using absorbers inside the enclosure of the RF amplifier.

In an exemplary implementation, the metallic post can be grounded (referred as grounded metallic post), to improve performance of the RF amplifier.

Another aspect of the present disclosure provides working principal of the metallic post for mitigating resonance caused in an RFPA enclosure. Working principal is based on reflection of waves, for suppressing resonance in a way by being helpful in breaking down the cavity. In an exemplary embodiment, the metallic post can be grounded or non-grounded, whereas the grounded metallic post can improve the performance with greater effect for mitigating the resonance in RF high power amplifier (RFPA).

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

In the Figures, similar components and/or features may have the same reference label. Further, various components of the same type may be distinguished by following the reference label with a second label that distinguishes among the similar components. If only the first reference label is used in the specification, the description is applicable to any one of the similar components having the same first reference label irrespective of the second reference label.

DETAILED DESCRIPTION

Figure 1:
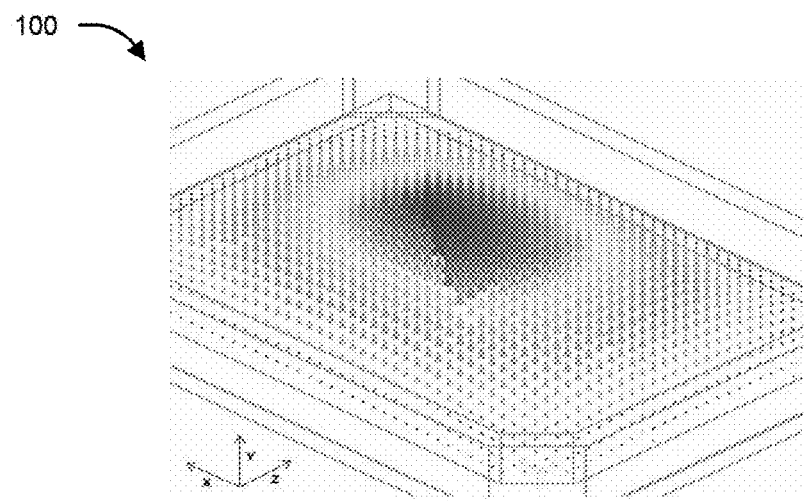
FIG. 1 illustrates an exemplary view depicting distribution of electric field (E-field) along X-axis, Y-axis and Z-axis within enclosure.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims.

Various terms as used herein are shown below. To the extent a term used in a claim is not defined below, it should be given the broadest definition persons in the pertinent art have given that term as reflected in printed publications and issued patents at the time of filing.

Embodiments of the present disclosure include various steps, which will be described below. The steps may be performed by hardware components or may be embodied in machine-executable instructions, which may be used to cause a general-purpose or special purpose processor programmed with the instructions to perform the steps. Alternatively, steps may be performed by a combination of hardware, software, firmware and/or by human operators.

If the specification states a component or feature "may", "can", "could", or "might" be included or have a characteristic, that particular component or feature is not required to be included or have the characteristic.

Although the present disclosure has been described with the purpose of mitigating resonance in RF high power amplifier, it should be appreciated that the same has been done merely to illustrate the disclosure in an exemplary manner and any other purpose or function for which explained structure or configuration can be used, is covered within the scope of the present disclosure.

Exemplary embodiments will now be described more fully hereinafter with reference to the accompanying drawings, in which exemplary embodiments are shown. This disclosure may, however, be embodied in many different forms and should not be construed as limited to the embodiments set forth herein. These embodiments are provided so that this disclosure will be thorough and complete and will fully convey the scope of the disclosure to those of ordinary skill in the art. Moreover, all statements herein reciting embodiments of the disclosure, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

Thus, for example, it will be appreciated by those of ordinary skill in the art that the diagrams, schematics, illustrations, and the like represent conceptual views or processes illustrating systems and methods embodying this disclosure. The functions of the various elements shown in the figures may be provided through the use of dedicated hardware as well as hardware capable of executing associated software. Their function may be carried out through the operation of program logic, through dedicated logic, through the interaction of program control and dedicated logic, or even manually, the particular technique being selectable by the entity implementing this disclosure. Those of ordinary skill in the art further understand that the exemplary hardware, software, processes, methods, and/or operating systems described herein are for illustrative purposes and, thus, are not intended to be limited to any particular named.

Aspects of the present disclosure generally relate to a RF high power Amplifier designed for resonance mitigation. A method for resonance mitigation in RF high power amplifier enclosure and an enclosure for RF high power amplifier designed to mitigate resonance is provided. In an aspect, the enclosure can be configured with a metallic post (also known as "grounded metallic post" and these terms are being used interchangeably hereinafter) positioned at a suitable location with RF high power amplifier circuit to dampen and shift out resonance.

In an aspect, the metallic post can be placed between printed circuit board (PCB) and the enclosure's lid, which provides a cost effective way to mitigate resonance caused by the enclosure of the RF power amplifier. The metallic grounded post can be used to break down cavity size inside the enclosure. In an embodiment, the grounded metallic post can be designed using Keysight EMPro. In another aspect, the metallic post can be arranged inside the enclosure to reflect waves generated by other components of the RF amplifier.

In a preferred aspect, a method based on reflection of waves for suppressing/mitigating resonance in RF high power amplifier is provided. The poynting vector is proportional to the square of the E-field in TE101 mode. The method includes the steps of: evaluating electric field that would be generated by other components of an RF power amplifier; determining location inside enclosure of the RF amplifier where E-field is maximum; and placing a metallic post at the location where E-field is maximum so as to mitigate resonance in the RF power amplifier. The metallic post is kept, where E-Field is maximum, as poynting vector is maximum at that point. In an exemplary implementation, location of maximum E-field can be determined based on evaluation of maximum E-field location of transverse electric mode i.e. TE101 mode, wherein E-field for transverse electric mode TE101 can be estimated using the equation below:

$$E_y = \frac{\beta_x}{\varepsilon} A_{101} \operatorname{Sin}\left(\frac{\pi x}{a}\right) \operatorname{Sin}\left(\frac{\pi z}{c}\right) \quad (3)$$

$$P = \frac{|E_y|^2}{2\eta} a_z \quad (4)$$

Where p is poynting vector. Poyning vector propagates in the wave direction.

As one may appreciate, the metallic post is a cheaper solution compared to isolating different stages or using absorbers inside the enclosure of the RF amplifier.

In an exemplary implementation, the metallic post can be grounded (referred as grounded metallic post), to improve performance of the RF amplifier.

Another aspect of the present disclosure provides working principal of the metallic post for mitigating resonance caused in an RFPA with an enclosure. Working principal is based on reflection of waves for suppressing resonance in a way by being helpful in breaking down the cavity. In an exemplary embodiment, the metallic post can be grounded or non-grounded, whereas the grounded metallic post can improve the performance with greater effect for mitigating the resonance in RF high power amplifier (RFPA).

In another aspect, RF Absorber can be kept below the enclosure's lid without the proposed metal post, for suppressing resonance and it exhibits temperature resistance.

Detailed analysis of H-field distribution with metallic post has been conducted. Different variations of the metallic post location, length and its effect on resonance have been studied.

An exemplary experimental set-up using 3D solver can be used to model cavity effect with layout and the proposed grounded metallic strip/post. Keysight EMPro can be used to perform simulation which is based on FEM solver. An exemplary layout has been included in the enclosure to consider the effect of dielectric loading. Junction temperature of the transistor has been observed by varying the enclosure's lid with different type of materials. The thermal simulation has been done with the help of CFD based FloTHERM from Mentor Graphics.

In an exemplary implementation, a RFPA for DCS1800 Band with output power of 44.5 dBm, gain of 50 dBm and efficiency greater than 40% can be designed. To achieve high gain & output power, three stages of amplification can be used and a symmetrical Doherty configuration can be used in the final stage to meet efficiency. Pre-driver can provide gain for example of 20 dB with P1 dB at 23 dBm. The driver can provide gain for example of 13 dB with P1 dB at 34.5 dBm. The final stage can provide gain of 17 dB with P1 dB at 47 dBm. The pre-driver and driver have been selected such that when final stage is operating at 44.5 dBm, they are still in linear region. Rogers 4350B substrate has been used with εr 3.48 and Tan δ=0.003.

Eigen Mode Analysis of Enclosure

In an exemplary implementation, cavity can be simply a rectangular waveguide shorted at both ends. As one may observe, direction of propagation of waves in the cavity can be different from the rectangular waveguide. In rectangular waveguide, direction of propagation is constant, i.e. in z-direction. Depending on the cavity excitation, wave can propgate in x-, y- and z-direction. First, let us consider the propagation in z-direction. In resonator, for TE101 mode E-Field at given instance of time can be in single direction i.e Ey. The resonant frequency of microwave cavity can be estimated by $$f_{mnl} = \frac{1}{2\sqrt{\mu\varepsilon}}\sqrt{\left(\frac{m}{A}\right)^2 + \left(\frac{n}{B}\right)^2 + \left(\frac{p}{C}\right)^2} \qquad (5)$$

where m, n, p are mode numbers and A, B, C are dimensions of the cavity in x-, y-, and z-direction respectively. The dimension of the enclosure for example can be 14.21*1.4*10.1 cm. The largest cavity dimension is given by 14.21 cm and free space wavelength is 16.58 cm. As the largest dimension of the enclosure in our required design is greater than one half of free space wavelengths, cavity issue is prominent. A resonant cavity has wall with finite conductivity, so resonance will incur loss. The Quality factor is a means of determining loss. In enclosure design, we should have less Q value to dampen the resonance. Wherein Q value for TE101 can be evaluated based on below given equation:

$$Q_{TE101} = \frac{(a^2 + b^2)abc}{\delta[2b(a^3 + c^3) + ac(a^2 + c^2)]} \qquad (6)$$

where Rs is the surface resistance. The enclosure can be made up of Aluminum. By solving Eq (6), Q-Value will come around 6005 on calculation.

In an exemplary implementation, for placing the metallic post, evaluation of potential electric field can be performed for the enclosure considering all the electrical components inside the enclosure.

FIG. 1 illustrates an exemplary view 100 depicting distribution of electric field (E-field) along X-axis, Y-axis and Z-axis within enclosure. As shown in FIG. 1, electrical field can be seen dominant in the center of the cavity.

Figure 2:
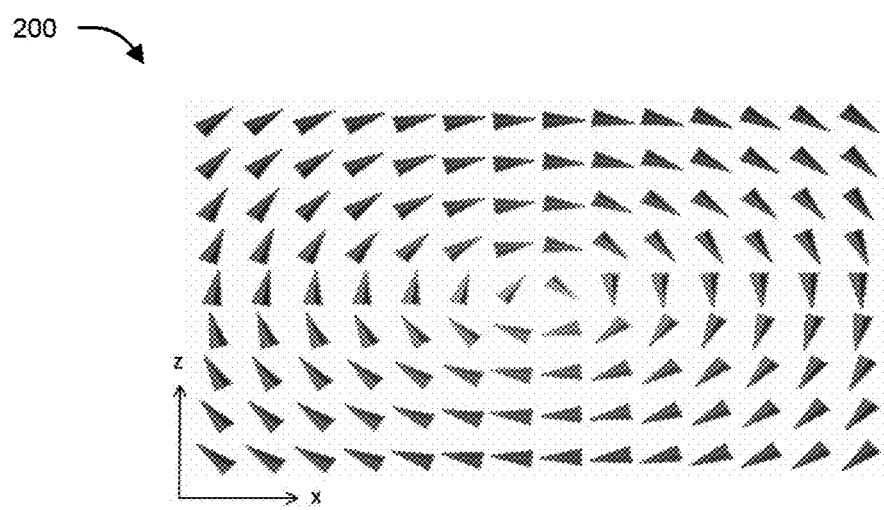
FIG. 2 illustrates an exemplary view depicting distribution of magnetic field (H-field) along X-axis, and Z-axis within enclosure before mitigation.

FIG. 2 illustrates an exemplary view 200 depicting distribution of magnetic field (H-field) along X-axis and Z-axis within enclosure before mitigation. FIG. 2 shows distribution of H-field in single standing wave pattern or propagation in single direction, before mitigation of the resonance by a metallic post.

Figure 3:
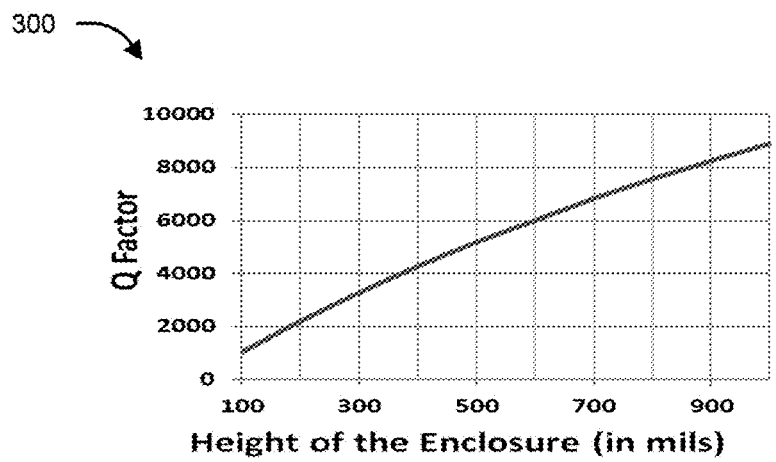
FIG. 3 illustrates an exemplary graph depicting effect of enclosure's height on Q factor.

FIG. 3 illustrates an exemplary graph 300 depicting effect of enclosure's height on Q factor. As shown in FIG. 3, height of the enclosure directly affects Quality (Q) factor, whereas length and width affects the resonance frequency but not the Q factor. The minimum height of the enclosure can be determined by the max component height or 15 times the substrate height.

In an embodiment, RFPA layout with substrate information can be kept inside the enclosure. Using such an arrangement, Eigen mode frequency shifted. Eigen mode with high Q value has been identified at 1.82 GHz, whereas mode distribution of this Eigen frequency has been analyzed with the help of an electromagnetic EM 3D simulator EMPro that does analysis using both frequency-domain and time-domain 3D EM simulation technologies: Finite Element Method (FEM) and Finite Difference Time Domain (FDTD). The field distribution is similar to TE 101 Mode.

Figure 4:
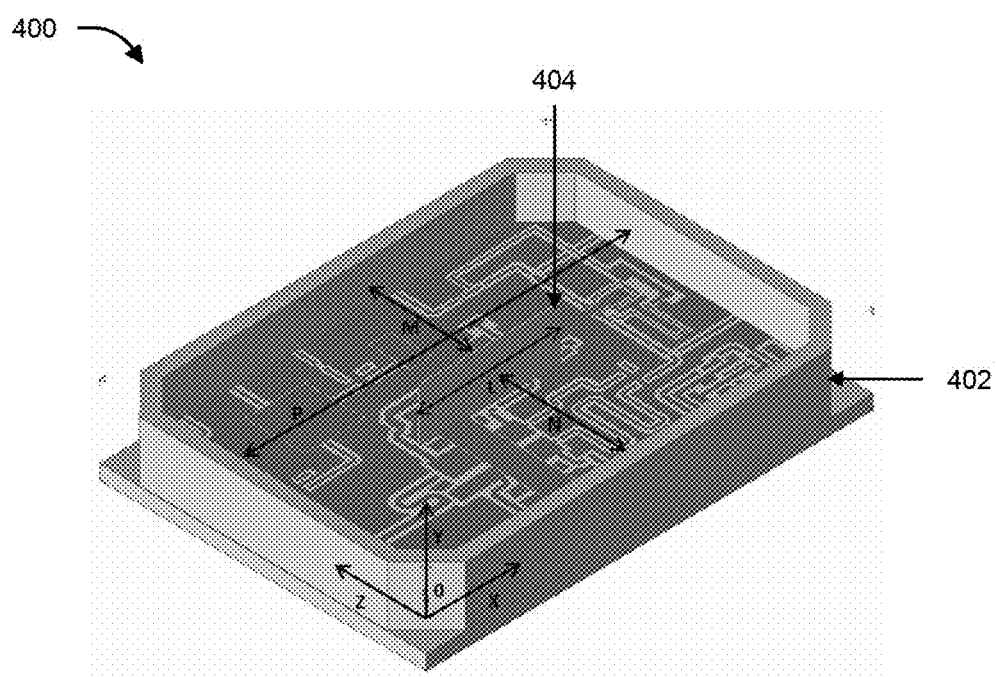
FIG. 4 illustrates an exemplary view of grounded metallic post positioned within RFPA apparatus enclosure in accordance with an embodiment of present disclosure.

FIG. 4 illustrates an exemplary view 400 of a grounded metallic post that is positioned within RFPA apparatus enclosure in accordance with an embodiment of present disclosure. As shown in FIG. 4, metallic post 404 can be kept between the printed circuit board (PCB) substrate and lid of the RFPA enclosure 402. The grounded metallic post can substantially improve performance while the mitigation of resonance works basically on the reflection of waves by the metallic post.

Design of Grounded Metallic Post

In an exemplary implementation, grounded metallic post can be used. The grounded metallic post can be kept in such a way that resonance loss increases, in other words Q value decreases. The metallic post can be kept inside the enclosure in the maximum E-Field location of transverse electric mode i.e. TE101 one of the dominant modes in rectangular waveguide. The basic component of a wave guide filter is a cavity resonator consisting of a short length of waveguide blocked at both ends. Waves trapped inside the resonator are reflected back and forth between the two ends.

The metallic post can be kept in such a way that majority of the waves can be reflected. From equation (Eq) (3) and FIG. 1, it is clear that E-Field varies sinusoidal w.r.t x & z. By solving Ey from equation (1), maximum E-Field can be found at x=A/2 and z=C/2. Poynting vector propagates in the wave direction. The poynting vector is proportional to Ey field. It is maximum at x=A/2 and z=C/2, the waves travels along z-direction, and therefore the post metallic post has to be perpendicular to z-direction to reflect the waves. The position along z-direction is fixed at C/2 such that the post divides the largest cavity dimension into half. If z>C/2 or z<C/2, the largest cavity cannot be divided into exact half.

In an exemplary implementation, length and center of the post along the x-direction has to be selected to reflect majority of the waves. The center of the post is fixed at x=A/2 as Ey and P are maximum at that point. Most of the waves are reflected when the length of the post is A/2. After that increasing the length of the post does not shift the eigen frequency significantly.

TABLE 1

TE101 Ey distribution and Eigen mode shift with Grounded metallic post

| S. No | Field Distribution Length of Metallic post L (in cm) | Eigen Mode with High Q value |
|---|---|---|
| 1 | 0 | 1.82 GHz |
| 2 | A/6 | 2.45 GHz |
| 3 | A/4 | 2.56 GHz |
| 4 | A/2 | 2.996 GHz |
| 5 | A | 3.2 GHz |

Figure 5:
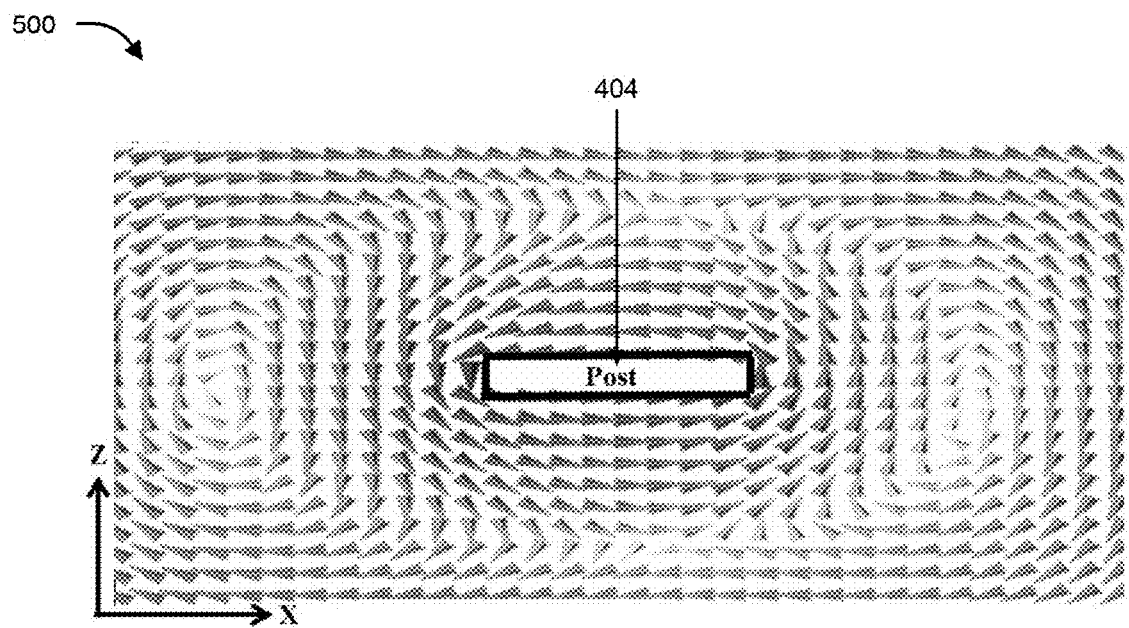
FIG. 5 illustrates an exemplary view depicting distribution of magnetic field (H-field) along X-axis, and Z-axis within enclosure of the RFPA after mitigation in accordance with an embodiment of present disclosure.

FIG. 5 illustrates an exemplary view 500 depicting distribution of magnetic field (H-field) along X-axis, and Z-axis within enclosure of the RFPA after mitigation in accordance with an embodiment of present disclosure. The distribution of H-field after mitigation of the resonance by metallic post 404 has been shown in FIG. 5. On close observation of H-Field distribution of the cavity with the metallic post 404, two standing wave patterns being formed can be found. The standing waves are formed above and below the post. The post prevents the waves to travel the largest dimension of the cavity. By this resonant frequency shifts to higher level.

In an alternate embodiment, the metallic post can also be kept perpendicular to x-direction also. Standing waves in x-direction will get reflected. In this case two standing waves will be formed above and below the post in x-direction.

Figure 6:
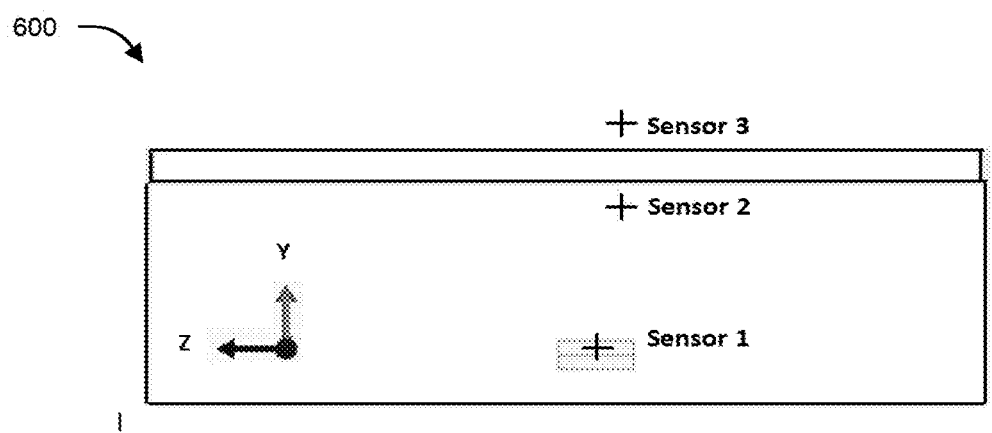
FIG. 6 illustrates an exemplary arrangement of thermal sensors.

FIG. 6 illustrates an exemplary arrangement 600 of thermal sensors. As shown in FIG. 6, thermal sensors have been kept in different locations to monitor the temperature. The + sign refers to the sensor location. Sensor 1 can be used to monitor junction temperature of the transistor. Sensor 2 and sensor 3 can be used to monitor inside and outside temperature of the enclosure, respectively.

Thermal Performance of Enclosure

The enclosure lid material is varied with aluminum and RF absorber material such as poly urethane. The transistor can be designed to operate around 44.5 dBm i.e. 28 W, wherein efficiency of the RFPA is around 40%. Therefore, thermal power radiated as heat is around 42 W. The thermal simulation is modelled with heat source of 42 W and thermal resistance, Junction to case ROJC as 0.74° C./W.

TABLE 2

Thermal distribution of enclosure

| S. No. | Material | Thermal Conductivity W/m K | Sensor 1 (degree) | Sensor 2 (degree) | Sensor 3 (degree) |
|---|---|---|---|---|---|
| 1 | Aluminum | 205 | 129.015 | 106.643 | 83.2141 |
| 2 | Poly urethane | 0.02 | 135.575 | 92.6 | 67 |

With RF absorber material, junction temperature of the transistor has been increased by 6.6° and heat radiation has been reduced in the top direction by 16.21°. Though temperature difference is less, continued operation of RFPA in hot environment (like transmission towers) can make the temperature difference noticeable. Proposed metallic post solution eliminates the needs of RF absorber in the design.

Figure 7A:
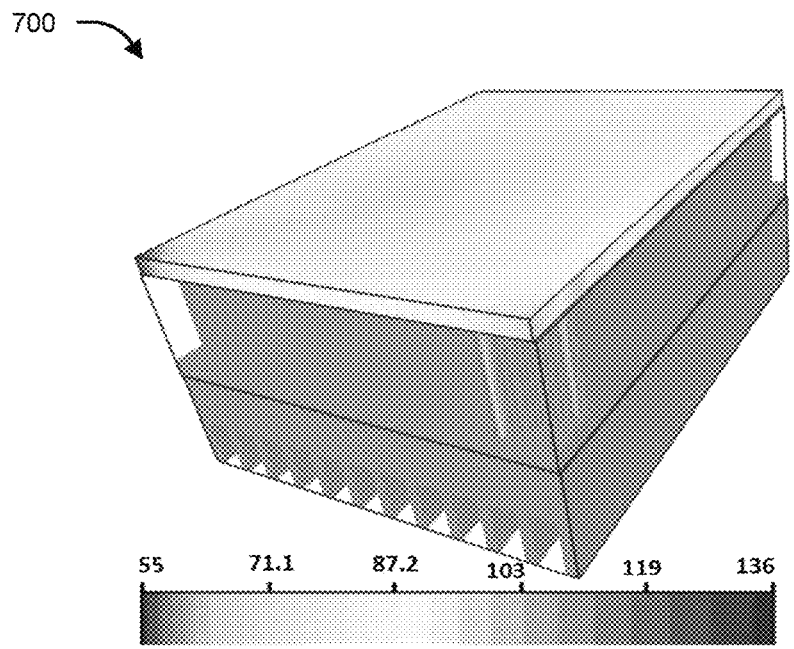
FIGS. 7A and 7B illustrate exemplary views that depict difference in temperature of RFPA enclosure's lid made with different material.
Figure 7B:
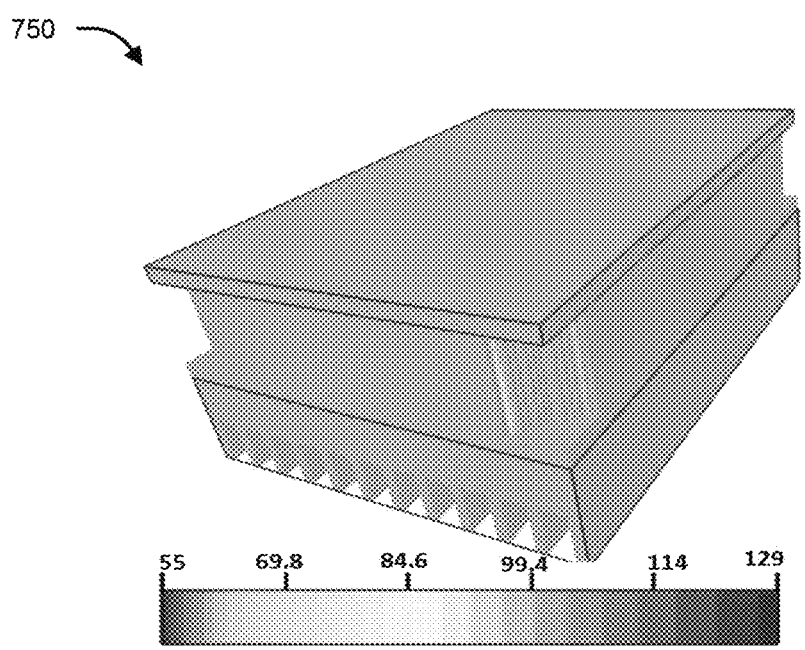

FIGS. 7A and 7B illustrate exemplary views 700 and 750 that depict difference in temperature of RFPA enclosure's lid made with different materials. As shown in FIG. 7A, enclosure top with RF absorber material i.e. poly urethane can be capable of reducing heat radiation in top direction, as observed by sensors 3. The temperature has been reduced to 16.21 degrees, as sensed, on the outer surface of the enclosure lid. On the other hand, in FIG. 7B, the enclosure lid is made of aluminum.

Effect of Optimized Grounded Metallic Post on RFPA

In an aspect, resonance in fabricated enclosure along with RFPA has been analyzed. Three different cases have been analyzed. Case 1 refers to RFPA without enclosure lid. In this case, RFPA is working without any oscillation. Case 2 refers to RFPA with enclosure lid. Once the lid is closed, oscillation occur at 1.78 GHz. This oscillation is capable of damaging the RFPA. Therefore, RFPA has to be tested with current limit in the power supply. The measured Eigen mode result is closely matching with simulated result. Case 3 refers to RFPA with both top cover and metallic post.

Figure 8:
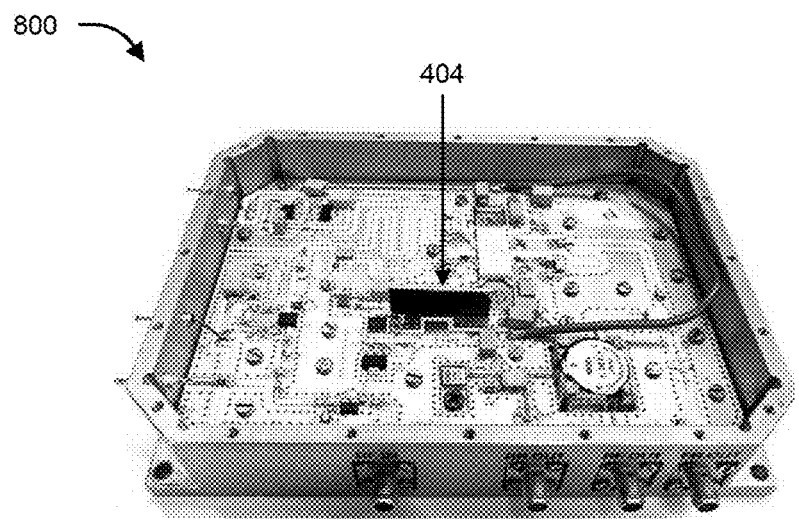
FIG. 8 illustrates an exemplary view depicting fabricated RFPA with grounded metallic post positioned in accordance with an embodiment of the present disclosure.

FIG. 8 illustrates an exemplary view 800 depicting fabricated RFPA with grounded metallic post 404 positioned in accordance with an embodiment of the present disclosure. As shown in FIG. 8, fabricated enclosure of RFPA includes both enclosure lid and metallic post 404. The grounded metallic post when placed between PCB and enclosure lid of RFPA's enclosure stops the oscillation and improves the performance.

In an embodiment, mitigation of resonance using metallic post can positively affect gain flatness, spurious measurement, input return loss (IRL) and adjacent channel power ratio (ACPR) and P1 dB compression of the RFPA. Dampening of resonance can be achieved by breaking down the cavity size using the grounded metallic post 404 (can be a metallic post as well).

As one may appreciate, in order to model the cavity effect with layout and grounded metallic strip, complete 3D simulator Keysight EMPro as a solver can be used to perform simulation based on Finite Element Method (FEM) solver. The layout can be included in the enclosure so as to consider the effect of dielectric loading. Junction temperature of the transistor can be observed by varying top cover made up of different type of materials. The thermal simulation and analysis can be done with the help of CFD techniques to predict airflow, temperature, and heat transfer in components, boards, and complete systems through FloTHERM from Mentor Graphics, for instance.

Figure 9:
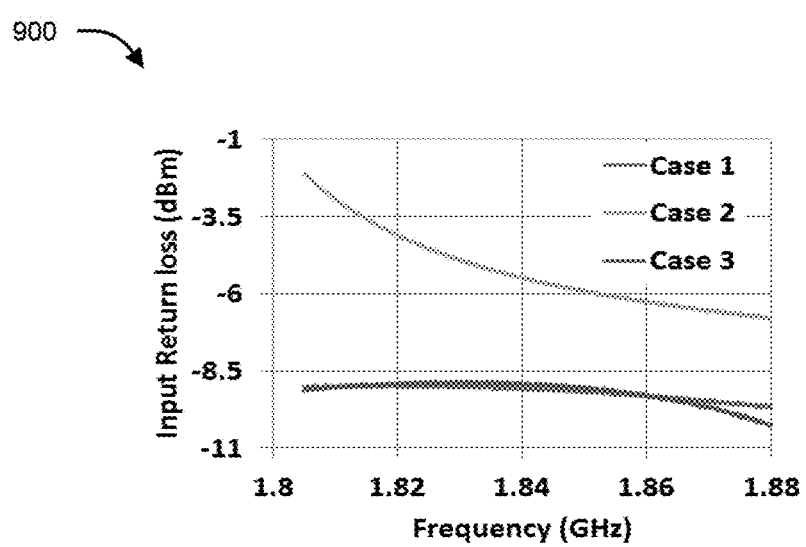
FIG. 9 illustrates an exemplary graph depicting input return loss for different cases.

FIG. 9 illustrates an exemplary graph 900 depicting input return loss for different cases in accordance with an embodiment of the present disclosure. As shown in FIG. 9, case 1 refers to RFPA enclosure without top cover, case 2 refers to RFPA enclosure with top cover, and case 3 refers to RFPA enclosure including both top cover and grounded metallic post. The input return loss for case 2 happens to be worst, as most of the power is reflected back to source.

Figure 10:
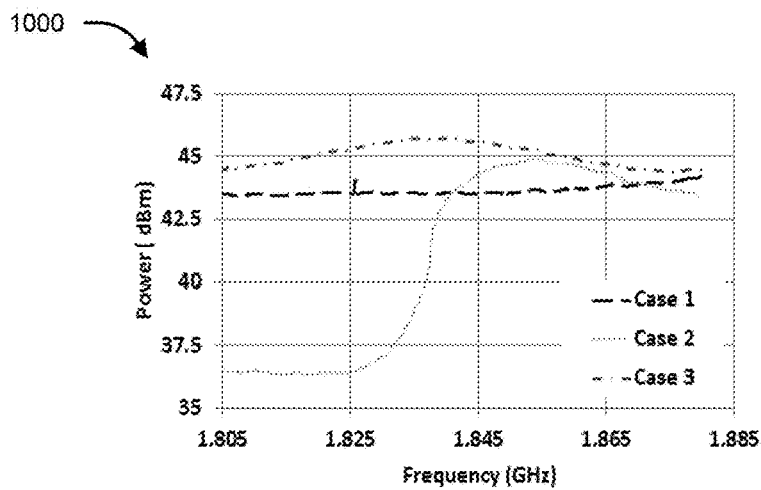
FIG. 10 illustrates an exemplary graph depicting gain flatness of RFPA designed in accordance with an embodiment of the present disclosure.

FIG. 10 illustrates an exemplary graph 1000 depicting gain flatness of RFPA designed in accordance with an embodiment of the present disclosure. As shown in FIG. 10, gain flatness of RFPA has been tested with fixed input power of 0.5 dBm. The gain of RFPA is increased after keeping the enclosure lid as shown in FIG. 10. The flatness in case 1, 2, and 3 are 0.76 dB, 8.18 dB and 1.25 dB respectively. As one may appreciate, with the help of metallic post, gain flatness has been improved.

Figure 11:
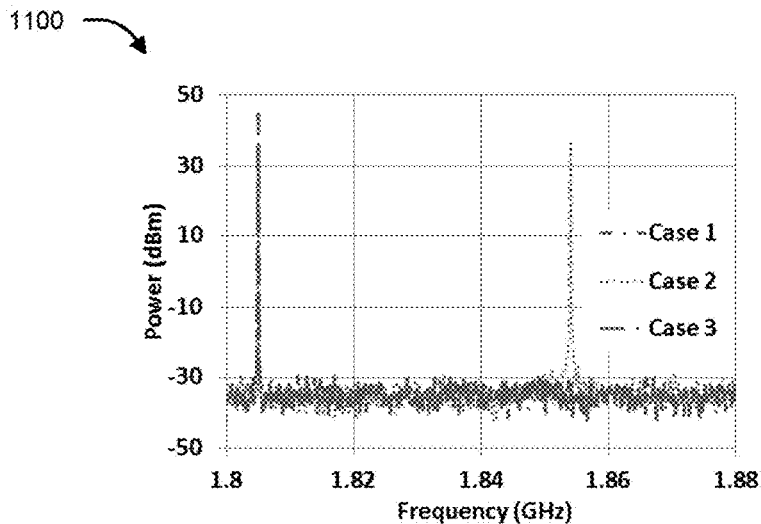
FIG. 11 illustrates an exemplary graph depicting spurious measurement of output power and frequency in accordance with an embodiment of the present disclosure.

FIG. 11 illustrates an exemplary graph 1100 depicting spurious measurement of output power and frequency in accordance with an embodiment of the present disclosure. As shown in FIG. 11, spurious measurement has been done at output power of 44.5 dBm and frequency at 1810 MHz. For case 1 and 3, spurious measured as 75.26 dBc and 74.04 dBc respectively. In case 2, due to resonance, spurious worsened to 0.722 dBc. In case 2, main carrier power has been reduced to 36.31 dB from 44.5 dBm.

In an embodiment, multi-carrier signal with 600 kHz spacing is used for adjacent channel power ratio (ACPR) measurement. In case 2, ACPR and average power degraded to −7.3 dBc and 27 dBm respectively. With metallic post used in case 3, ACPR has improved closely to open condition as seen in case 1.

TABLE 3

ACPR measurement for 3 carriers:

| Cases | Avg power dBm | Carrier Frequency @ 1842.5 MHz offset frequencies | | | | | | |
|---|---|---|---|---|---|---|---|---|
| | | 0.4 MHz | 0.6 MHz | 0.8 MHz | 1 MHz | 1.2 MHz | 1.6 MHz | 1.8 MHz |
| Case 1 | 32.41 | −60.7 | −26 | −61.2 | −66.8 | −32.4 | −72.2 | −35.7 |
| Case 2 | 27 | −35.9 | −7.3 | −37.5 | −38.7 | −17.4 | −39.1 | −8.9 |
| Case 3 | 32.41 | −58.7 | −23.7 | −59.2 | −64.1 | −29.7 | −67.9 | −28.7 |

Figure 12:
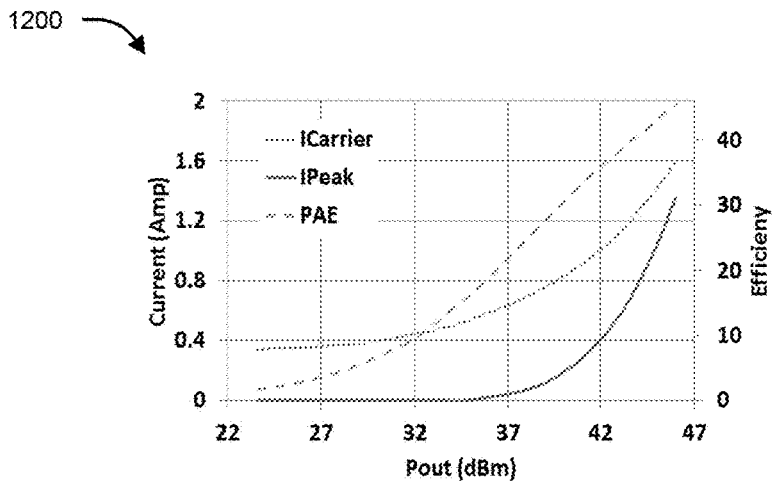
FIG. 12 illustrates an exemplary graph depicting RFPA efficiency (RFPAE) and currents of Doherty configuration for enclosure designed in accordance with an embodiment of the present disclosure.

FIG. 12 illustrates an exemplary graph 1200 depicting RFPA efficiency (RFPAE) and currents of Doherty configuration for enclosure designed in accordance with an embodiment of the present disclosure.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc. The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

While embodiments of the present disclosure have been illustrated and described, it will be clear that the disclosure is not limited to these embodiments only. Numerous modifications, changes, variations, substitutions, and equivalents will be apparent to those skilled in the art, without departing from the spirit and scope of the disclosure, as described in the claims.

Advantages of the Invention

The present disclosure provides an arrangement for resonance mitigation in a RF high power amplifier.

The present disclosure provides a method of mitigating resonance caused in the device enclosure of a radio frequency high power amplifier (RFPA).

The present disclosure provides a method for resonance mitigation in RF high power amplifier.

The present disclosure provides a method for dampening of resonance without raising the temperature of RFPA device enclosure.

The present disclosure provides a RF high power amplifier designed to break down cavity size of its enclosure.

What is claimed is:

1. A radio frequency high power Amplifier (RFPA) configured in an enclosure, wherein the enclosure is further configured with a metallic post positioned at a suitable location with respect to the RFPA to dampen and shift out resonance, and wherein the suitable location is determined by:
   evaluating electric field generated by other components of the RFPA;
   evaluating poynting vector which is proportional to square of the electric field; and
   determining the suitable location inside the enclosure of the RFPA where the poynting vector is maximum.

2. The RFPA of claim 1, wherein the metallic post is positioned between printed circuit board (PCB) and top cover of the enclosure.

3. The RFPA of claim 1, wherein the metallic post is configured to break down cavity size inside the enclosure.

4. The RFPA of claim 1, wherein the metallic post is grounded and designed using simulation software.

5. The RFPA of claim 1, wherein the metallic post is arranged inside the enclosure to reflect waves generated by other components of the RFPA.

6. The RFPA of claim 1, wherein usage of RF absorber inside the enclosure increases the junction temperature of the transistor.

7. A method to suppress resonance in radio frequency high power amplifier (RFPA) that is configured in an enclosure, said method comprising:
   evaluating electric field generated by other components of the RFPA;
   evaluating poynting vector which is proportional to square of the electric field;

determining location inside the enclosure of the RFPA where the poynting vector is maximum; and placing a metallic post at the location where poynting vector is maximum so as to mitigate resonance in the RFPA.

8. The method of claim 7, wherein location of maximum poynting vector is determined based on evaluation of maximum poynting vector location of transverse electric mode of TE101 mode, wherein poynting vector for transverse electric mode is estimated as $$P = \frac{|E_y|^2}{2\eta} a_z.$$

* * * * *